United States Patent [19]

Dlugos

[11] 3,913,095

[45] Oct. 14, 1975

[54] PHOTODETECTOR COMPENSATING CIRCUIT FOR A POSTAGE METERING SYSTEM

[75] Inventor: Daniel F. Dlugos, Huntington, Conn.

[73] Assignee: Pitney-Bowes, Inc., Stamford, Conn.

[22] Filed: July 19, 1973

[21] Appl. No.: 380,842

[52] U.S. Cl.... 340/347 P; 177/DIG. 3; 177/DIG. 6; 340/347 CC

[51] Int. Cl.$^2$........................................... G08C 9/06

[58] Field of Search.................. 340/347 P, 347 CC; 177/DIG. 3, DIG. 6

[56] References Cited

UNITED STATES PATENTS

| | | | |
|---|---|---|---|
| 3,061,026 | 10/1962 | Hecox et al. | 340/347 P X |
| 3,096,444 | 7/1963 | Seward | 340/347 P X |
| 3,205,491 | 9/1965 | Brown et al. | 340/347 P |
| 3,247,505 | 4/1966 | Coyle | 340/347 P |
| 3,445,841 | 5/1969 | Parkinson | 340/347 P |
| 3,534,361 | 10/1970 | Foley, Jr. et al. | 340/347 P |

*Primary Examiner*—Charles D. Miller
*Attorney, Agent, or Firm*—William D. Soltow, Jr.; Albert W. Scribner; Robert S. Salzman

[57] ABSTRACT

The operating characteristics of a photodector device are controlled by a compensating photodetector of the same type, which is coupled to a source of potential and to the photodetector device for controlling the biasing thereon. The photodetector devices are irradiated from a common source and the amount of radiation applied to the compensating photodetector is controlled by a filter, screen, adjustable iris, etc., to fix the operating point of the photodetector. Changes in source radiation caused by changes in line voltage, aging of the source, atmospheric conditions, temperature changes etc., affect both photodetector devices equally, thereby resulting in a dynamic bias which maintains the operating characteristics of the photodetector device. This circuit is shown applied to a photoelectric encoder in which an image of a reticle coupled to a scale is projected on a bank of photodetectors which generate a code in accordance with the amount of weight on the scale. The compensating circuit is used with the photodetector device applying the least significant bit of the code to control the code generation by the other photodetectors to insure accuracy regardless of the occurrence of unwanted intensity variations in the projected image.

10 Claims, 7 Drawing Figures

PHOTODETECTOR COMPENSATING CIRCUIT FOR A POSTAGE METERING SYSTEM

BACKGROUND OF THE INVENTION

This invention relates to a photodetector compensating circuit and more particularly to the application of such a circuit to a photoelectric encoder, which converts a weight or measure from analog to digital form for controlling a postal metering system.

Photodetector devices have been commonly employed in photoelectric encoders or readouts where a source of radiation is applied to a coded chart, scale, reticle, etc., and the radiation transmitted or passed therethrough is detected by either a single or an array of photodetector devices. If the operating characteristics of the photodetector are changed due to undesired radiation changes caused by variations in the intensity of the source, such as aging or a change in source voltage, changes in temperature, environmental changes which affect the amount of transmission of the source to the photo device, etc., errors will result in the code or the readout generated therefrom. Conventional biasing methods utilizing resistor biasing do not deal with these problems. The use of temperature compensating resistors can handle the change in characteristics with respect to temperature changes within limits, but do not deal with the changes in radiation due to aging of the source, change in the source voltage, atmospheric transmission, etc. For applications such as the use of encoders in postal metering systems where the minimal or non-contact approach utilized by optical encoders is desirable because it does not disturb the weighing process, the types of errors generated by the optical system as heretofore discussed must be compensated for to avoid costly errors in billing, which can accumulate rapidly with continued and prolonged use.

Accordingly, it is an object of this invention to provide a photodetector compensating circuit which compensates for intensity and temperature variations and also improves the response of the photodetector device.

A further object of this invention is to provide a photoelectric encoder for use in a postal metering system which provides compensation for unwanted radiation variations in the optical system to prevent errors in billing in a postal metering system.

SUMMARY OF THE INVENTION

In carrying out this invention in one illustrative embodiment thereof, the photodetector compensating circuit embodied in this invention is employed in a photoelectric encoder in which an image of a coded reticle coupled to a measuring scale is projected on a bank or array of photodetectors which generate a code in accordance with the amount of weight on the scale. The compensating circuit comprises a compensating photodetector device coupled to the photodetective device of the photodetective array which supplies the least significant bit of the code generated. The compensation circuit photodetectors are illuminated by the same source. The compensating photodetector is provided with a means for controlling the amount of radiation from the source applied thereto for setting the biasing level on the compensated photodetector device. Accordingly, changes in intensity of radiation received affect the operation of both the compensating photodetector and the compensated photodetector such that the operating characteristics of the compensated photodetector remain the same.

DESCRIPTION OF THE PREFERRED EMBODIMENTS

Figure 1:
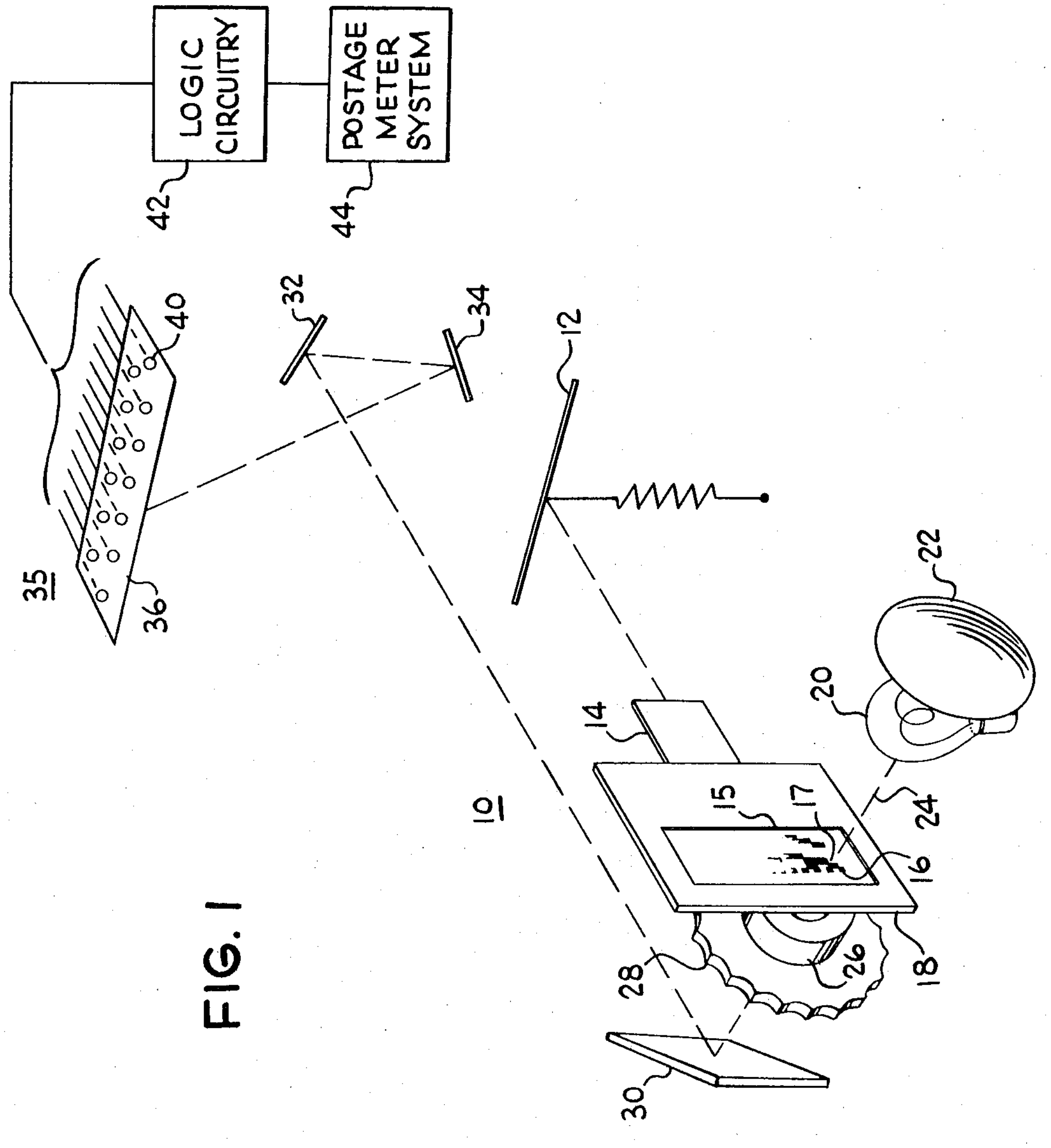
FIG. 1 is a diagrammatic representation of a photoelectric encoder utilized in a postal metering system in accordance with the present invention.

Referring now to FIG. 1, which is used to illustrate an important application of the present invention to a postal metering system, a weighing scale designated generally with the reference character 12 is provided in which loads, such as envelopes and parcels, are placed for weighing. A weighing scale suitable for this application is shown and described in an application entitled "Leaf Spring Scale,"Ser. No. 318,546, filed Dec. 26, 1972 for inventor Gerald C. Freeman, which application is assigned to the assignee of the present application. The optical projection system illustrated in FIG. 1 also has the same general configuration as that shown in the aforesaid application to illustrate the applicant's invention with respect thereto, but it will be apparent to those skilled in the art that the invention is not considered limited solely to the application shown and described in the aforesaid patent application.

The optical projection system has a radiation source or lamp 20 with a reflector 22 for directing most of the radiation in the form of light through an aperture mask 18 and onto a coded reticle 15. the coded reticle 15 is comprised of opaque bars 16 and transparent sectors 17 which act to block or pass light from the source 20 in accordance with their position to generate, when the light passed therethrough is detected, a code corresponding to a weight on the scale 12. An arm 14 connected to the reticle 15 is coupled to the scale 12 for movement therewith, such that changes in the weight of the object on scale 12 move the arm, and accordingly reticle 15 proportionately thereto to provide a different indicia for different weights on the scale. The locations of the arm 14 and the reticle 15 are particularly selected to minimize effects of load shifts on the scale 12, in accordance with the aforesaid patent application. An adjustable focusing lens 26, adjusted by the knob 28, directs light passed through the reticle 15 onto a mirror 30 which reflects the light to a mirror 32, to mirror 34, which reflects the light on an image plane 36. As previously stated, the mirror arrangement utilizing mirrors 30, 32 and 34 is solely for the purposes of directing the light through various structures of the scale 12, and it will be apparent that the path of the light may be varied in accordance with the particular application and type of scale utilized. The focusing lens 26 produces a greatly magnified image of the reticle 15 on the image plane 36, at which is located a bank or array of photodetector devices 35. The array or bank of photodetectors 35 is arranged in spaced rows 37 and 39 such that one detector is associated with each opaque and transparent column or array in the reticle 15, which provides at the output thereof an indication or information bit related to the weight on the scale 12. Accordingly, each photodetector device in the array 35 may generate a code bit such that the reticle 15 and the array of photodetectors 35 constitute an analog-to-digital conversion in accordance with the amount of weight on the scale 12. The output of the bank of the photodectors 35 are applied to logic circuitry 42 for thresholding, shaping and processing providing a signal for a postage meter 44 which automatically issues the metered postage for the weight on the scale 12.

Indicated in the bank of photodetectors 35 is a photodetector device 40 which is shown located at one end of the bank of photodetectors 35. Although the position of photodetector device 40 within the bank of photodetectors 35 is not important, the fact that photodetector 40 cooperating with reticle 15 senses the least significant bit for the analog-to-digital code is important, because the photodetector 40 also decides which photodetectors in the array are utilized for reading the code at any given time. As will be described in detail hereinafter, photodetector 40 is provided with a compensation circuit to insure that it will switch consistently at the same instant of time with the movement of reticle 15 from transparent areas 17 to opaque areas 16 (light to dark) or from opaque to transparent (dark to light). Accordingly, only one photodetector in the array, that being photodetector 40, must be precisely located and compensated for sensitivity changes. Photodetector 40, then, is used to determine which of the other detectors, rows 37 or 39, are selected and read when photodetector 40 goes through a transition from light to dark or from dark to light. The opaque and transparent areas 16 and 17, respectively, of reticle 15 are so arranged that photodetectors 37 and 39 are stabilized and solidly viewing either opaque or transparent areas of the projected bar code because of their relative positions with respect to photodetector 40. This method of selection of photodetectors avoids a source of error which would occur if several photodetectors were simultaneously changing state at different times from light to dark or from dark to light patterns on the reticle 15.

Figure 2:
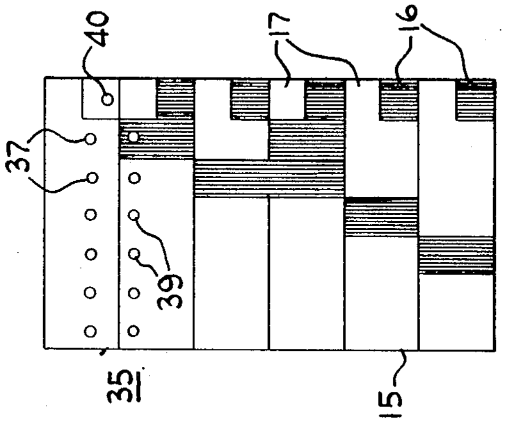
FIG. 2 shows one form of reticle suitable for use in the postal metering system of FIG. 1.

The operation of the reticle with the cooperating photodetectors is more clearly illustrated in FIG. 2. The bank of photodetectors 35 is comprised of photodetector rows 37 and 39 which are spaced a distance equivalent to one code slot with the photodetector 40 being positioned at half the distance between the two photodetector rows 37 and 39. The code column on the right of the reticle 15, made up of clear or transparent areas 17 and opaque or black bars 16, is monitored by photodetector 40 for generating the least significant digit of the code and controlling the selection of either photodetector row 37 or 39 for generating the proper code in accordance with the deflection or movement of the reticle 15 by the scale 12. Each code column of the reticle 15 is made up of different bars 16 and transparent areas 17 which are read in accordance with position by either a photodetector in row 37 or in row 39 in accordance with the selection made by photodetector 40 with the actual switching performed by suitable logic circuitry such as illustrated in FIG. 3.

The code illustrated on reticle 15 in FIG. 2 is a binary coded decimal (BCD) code in pound designations, but it will be understood that other types of codes as well as different weight designations for the selected code may be utilized without departing from the teachings of the present invention.

Figure 3:
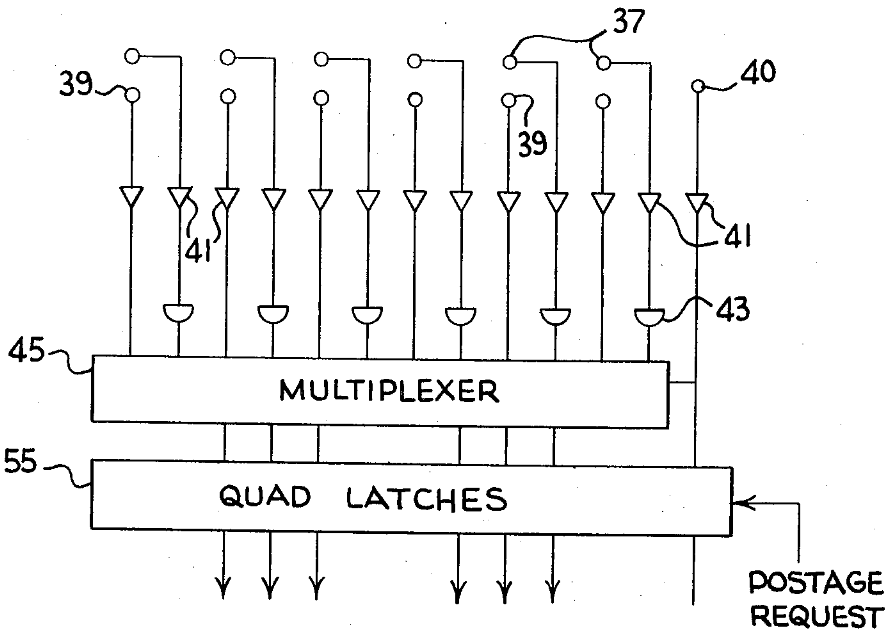
FIG. 3 is a schematic diagram of one form of logic circuitry which may be employed with the reticle of FIG. 2 for use in the system shown in FIG. 1.

FIG. 3 illustrates one form of logic circuitry which may be used to adapt the present invention for use in a postal metering system described in U.S. Pat. No. 3,692,988 to Dlugos et al. which is assigned to the assignee of the present invention. The individual photodetectors in rows 37 and 39, as well as photodetector 40, are provided with individual amplifiers 41 which are coupled to a multiplexer 45. The photodetector row 37 also has inverters 43 connected between each amplifier 41 to the multiplexer 45 due to the input characteristics of multiplexer 45. The multiplexer 45 is a 2-input, 4-bit digital multiplexer, for example, Digital 8,000 Series TTL/MSI (exact number 8,266) made by Signetics, Sunnyvale, California. The output of the multiplexer 45 is fed to quad latches 55 which are also coupled to the photodetector 40 and a postage request input supplied from the system set forth in the aforesaid patent. The quad latches function to select and generate the code in the multiplexer when a postage request is received.

Figure 4:
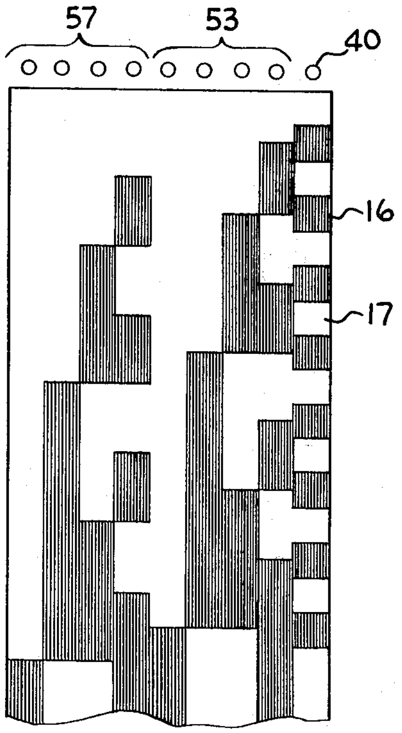
FIG. 4 shows another form of reticle and photodetector array which may be employed in accordance with the present invention.

FIG. 4 illustrates the use of a linear photodetector array 51 and another form of cooperating coded reticle 19 having opaque and transparent areas 16 and 17, respectively. The linear photodetector array 51 is made up of the photodetector 40 located at one end of the array and groups of photodetectors 53 and 57. Again, photodetector 40 in cooperattion with the right hand column of reticle 19 generates the least significant bit of code generated by the system and also selects either photodetectors 53 or 57 for providing the remainder of the code at any given movement of the reticle 19 in accordance with a given weight on a scale. The reticle 19 has a duplicated, but shifted pattern after the right hand column. This is to insure that on a transition of photodetector 40 from a transparent to opaque area, photodetectors 53 are viewing either transparent or opaque areas without transitions and when photodetector 40 passes through the next transition, photodetectors 57 are viewing either transparent or opaque areas with no transitions. As with the embodiment of FIG. 2, if the photodetector 40 switches precisely at the same point during transition from light to dark or vice versa, no errors occur due to a number of photodetector crossing transitions simultaneously but switching at different points during such periods. The code of FIG. 4 is also a BCD code arranged in ounces up to a pound and then in half pounds. As previously stated, many different codes as well as weight or measure designations may be used. Logic circuitry similar to that shown in FIG. 3 may be utilized with the embodiment of FIG. 4 to generate the desired code.

Figure 5:
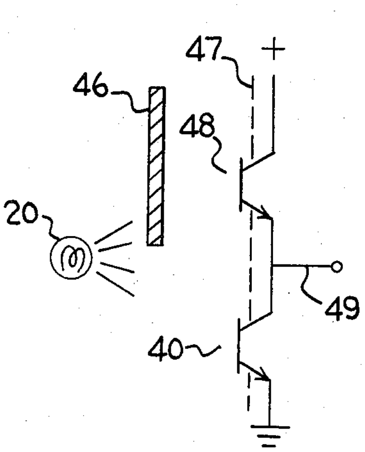
FIG. 5 is a schematic diagram showing one form of the photodetector compensation circuit embodied in this invention utilizing phototransistors.

In order to insure that no error is generated, the photoconductive device 40 must switch consistently in the same position. To insure that the operating characteristics of the photoconductor 40, which generates the least significant bit, will not change, a compensation circuit shown in FIG. 4 is provided therefore. As shown in FIG. 4, the type of photodetector device illustrated is a phototransistor 40. as described in connection with FIG. 1, the phototransistor 40 is used to detect the presence or absence of an object, such as a black bar or opaque sector 16 on a reticle 15 which is projected by the optical system of FIG. 1 on the phototransistor. It will be apparent to those skilled in the art that other types of photodetectors may be utilized, and the application may be for any difference in light levels, however generated. As shown in FIG. 5, a compensating phototransistor 48, having similar operating characteristics as phototransistor 40, is coupled between a source of positive potential and the collector electrode of phototransistor 40, having an output at terminal 49. The phototransistor operates with a reverse-bias base-collector junction, and due to the voltage applied between the emitter and the collector, little current flows when the base is not illuminated. Upon illumination, holes are excited in the base region, which diffuse out, leaving an over-all negative charge. This charge forward biases the emitter-base junction so that holes are injected into the base and move across the collector. A current of holes from the emitter to collector continues until the negative charge of excess electrons in the base region is neutralized by recombination. The function of the phototransistor 48 is to set the detection level or back-biasing on the phototransistor 40, so that the output voltage at terminal 49 is at a predetermined level when the light level on the phototransistor 40 is at the desired detection level. The biasing set by the phototransistor 48 is controlled by adjusting the aperture 46, which may be in the form of an adjustable iris, a screen, or a neutral density filter, or some other suitable means, which restricts the amount of light from the source 20 being applied to the base junction of phototransistor 48. The amount of light hitting the phototransistor 48 sets the biasing level on phototransistor 40. Ideally, phototransistors 48 and 40 should have identical characteristics, but this is not essential to obtain good results. The only real requirement is that the devices should be of the same type, for example, if the photodetector device is a phototransistor, then the compensating device should be, likewise, a phototransistor, and the same with respect to other types of photodetectors.

Light intensity compensation is achieved by the circuit in FIG. 4, because both photodetectors 48 and 40 are illuminated by the same source, so that if the light intensity degrades by, say, 10%, the decrease in light current in the photodetectors 48 and 40 is similar because the number of photons available to create current-carrying electron-hole pairs is reduced for both, maintaining the current ratio balance between the devices set at the start. Accordingly, if the light source 20 ages and degrades, both detectors are affected alike; the same result is obtained if the line voltage changes, affecting the intensity of the light, or any other thing which produces a change in light intensity, for example environmental conditions. Since any such changes affect both phototransistors alike, transistor 48 presents a dynamic biasing arrangement which changes in accordance with the illuminated condition to automatically compensate phototransistor 40 for such changes. Since temperature variations also affect the number of electron hole pairs in the phototransistors, the compensation circuit shown in FIG. 4 will also compensate in a similar manner if both devices are kept at the same temperature. The devices are located in the same proximity, so will normally be at the same temperature, but to ensure that they have the same temperature the phototransistors 48 and 40 may be mounted on a common heat sink, indicated diagrammatically by the reference character 47, which produces a large thermal mass and would maintain the two photodetectors at approximately the same temperature.

Figure 6:
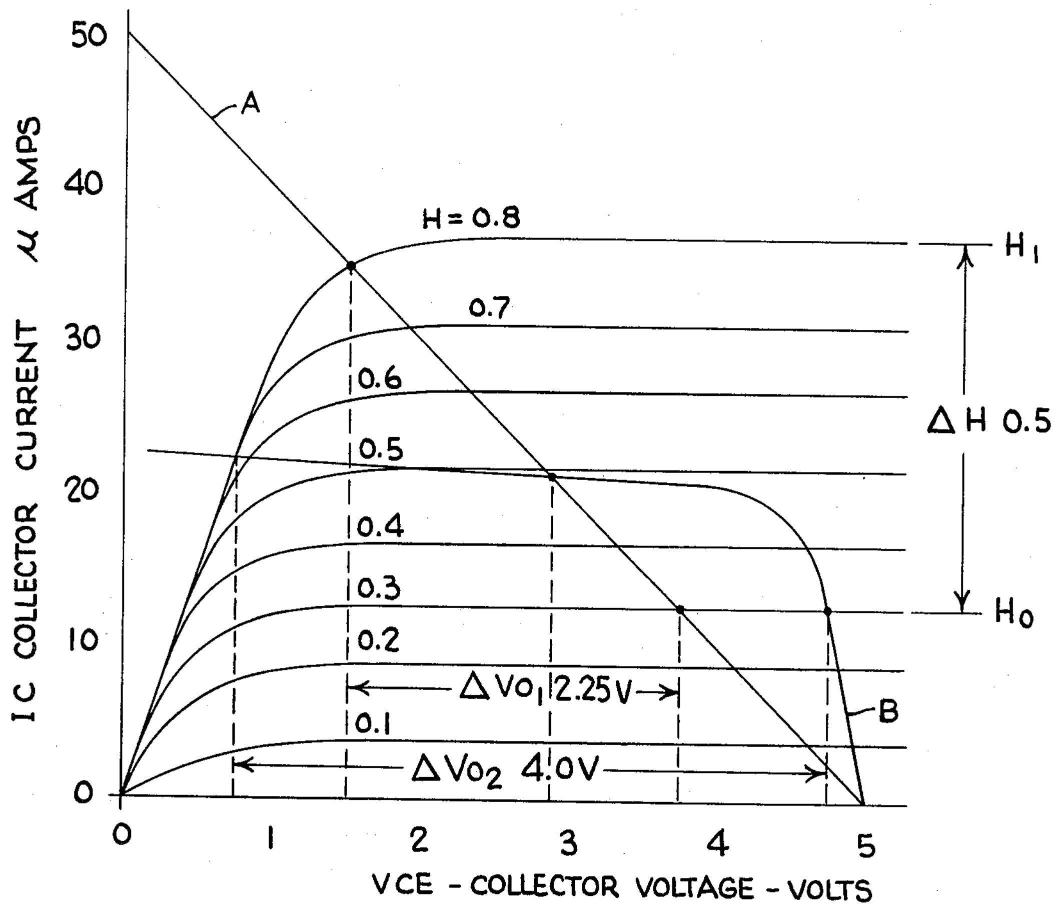
FIG. 6 is a graph illustrating phototransistor collector current vs. collector voltage characteristics which will be used to describe the operation of the photodetector compensation circuit embodied in this invention.

The dynamic biasing configuration shown in FIG. 5 can best be described in terms of photocurrent vs collector voltage of the phototransistor 40 using a phototransistor 48 for bias instead of a conventional bias resistor. FIG. 6 shows a typical phototransistor photocurrent vs collector voltage characteristic. FIG. 6 also includes circuit representations A of a resistor-biased phototransistor and circuit B which is a phototransistor-biased phototransistor as shown in FIG. 2. On the graph of FIG. 6, A represents the transistor load line for circuit A, and B represents the phototransistor load line of circuit B; H is radiant energy; $H_0$ represents a low light level, for example where a bar of the reticle 15 covers the source; $H_1$ represents a high level, for example with no bar appearing on the reticle, or a transparent section separating the phototransistor from the light source; ΔH represents the difference between the high and low light levels with the switching level desired to be set at about half this difference. $\Delta V_{01}$ represents the voltage between light and dark of circuit A, and $\Delta V_{02}$ represents the voltage operating range of circuit B. The resistor load line A is the collector current versus collector voltage relationship which the output voltage $V_{01}$ of circuit A will follow for variations in radiant energy on the phototransistor. Phototransistor load line B is the collector current versus collector voltage relationship which the output voltage $V_{02}$ will follow for variations in radiant energy on the phototransistor. It will readily be seen from a comparison that for a ΔH of 0.5 milliwatts/$cm^2$, the range of the output voltage $V_0$ for the photoconductive circuit is nearly doubled by utilizing the compensation circuit of this invention represented by B in comparison to the standard resistance-bias circuit of A.

Since changes in light level and/or temperature affects both devices similarly this switching characteristic will remain relatively the same over a wide range of conditions.

Figure 7:
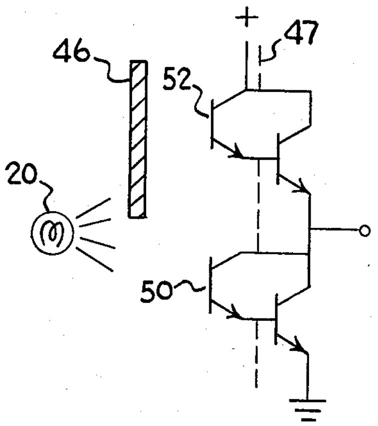
FIG. 7 is a schematic diagram of another embodiment of this invention utilizing photodarlingtons.

FIG. 7 shows the compensation circuit in accordance with this invention, illustrating the use of a different type of photodevice in the form of a photodarlington. The photodarlington 52 is connected between a source of positive potential and another photodarlington 50. The arrangement is the same as in FIG. 5, with a common source 20 and a radiant energy control means 46 in the form of a filter, screen, or variable iris for applying radiation to the photodarlington 52 which sets the biasing level on the photodarlington 50. The circuit operates in substantially the same fashion as that shown in FIG. 5, but the photodarlington's characteristic curves are different than the phototransistor, and have less slope, but the compensation circuit improves the dynamic range of the photodarlington with somewhat less snappy switching. The photodarlington is characterized by higher gain and slower speed, so it would depend on the particular application in which the photodetectors are to be used, as to which type of photodetector would be employed. It will also be apparent that other types of photodetectors may be utilized in accordance with the principles of this invention, as long as the same type is used for the compensating and compensated device, such that they have the same or similar operating characteristics and so that changes in source level or temperature affect the two in a similar manner.

In the described application to a postal metering system, with the compensated circuit located on the photodetector device which handles the least significant bit in a coded arrangement, the smallest increment of the code is monitored, and other uncompensated detectors are free to read the remainder of the code in accordance with the reticle position with no degradion in accuracy. By utilizing the compensation circuit of the present invention, the switching arrangement is not significantly affected by changes in light intensity due to undesirable causes such as change in light voltage, aging of the source, environmental interference with the transmission of light from the source to the photodetector, and other system errors between the source and the photodetector device. The switching range is considerably increased, and errors due to changes in the light intensity which are unwanted do not affect the operation of the system for generating the proper code. If compensation were not provided, the switching function which selects the detectors reading the code would be subject to error if the switching range did not cover changes in source intensity which are undesirable. Although the invention is described in connection with a postal metering system, it will be apparent to those skilled in the art that it will have wider application and will be suitable for use in other types of systems where similar problems exist.

Since other modifications and changes varied to fit particular operating requirements and environments will be apparent to those skilled in the art, the invention is not considered limited to the examples chosen for purposes of disclosure, and covers all modifications and changes which do not constitute departures from the true spirit and scope of this invention.

Having described my invention, what I claim as new and desire to secure by Letters Patent is:

1. A scale system having a photoelectric encoder for generating a code representing a weight on a scale, comprising, in combination:

A. an encoder in the form of a reticle having opaque and transparent areas forming at least one track and representing a predetermined code in accordance with a predetermined range of weights, B. a scale for measuring said predetermined range of weights, C. means for coupling said reticle to said scale such that said reticle moves a predetermined amount in accordance with the range of weights to be measured on said scale, D. an array of photodetectors, E. means for projecting an image of said reticle on said array of photodetectors whereby said photodetectors generate a code in accordance with the weight on said scale, F. a compensation circuit coupled to a first one of said photodetectors in said array, which said first photodetector of said array is used for reading a least significant bit in said code, said compensation circuit having a dynamic biasing means for compensating said first photodetector, said dynamic biasing means comprising a second photodetector independent of said code generating photodetector array, which said second photodetector has substantially the same operating characteristics as said first photodetector of said array and which varies in accordance with undesirable light intensity and temperature variations, said second independent photodetector used solely for compensating said first photodetector of said array for said undesirable light and temperature variations; and G. means for controlling the intensity of light applied to said second independent photodetector.

2. The scale system as set forth in claim 1 wherein said first and second photodetectors are phototransistors.

3. The scale system set forth in claim 1 wherein said first and second photodetectors are photodarlingtons.

4. The scale system set forth in claim 1 wherein said means for controlling the light intensity comprises a neutral density filter.

5. The scale system set forth in claim 1 wherein said first and second photodetectors are mounted on a common heat sink.

6. The scale system set forth in claim 1 wherein said array of photodetectors comprises two rows of photodetectors spaced one code slot apart with said first photodetector positioned halfway therebetween for generating the least significant bit in said code and providing a means of selecting one or the other of said row of photodetectors for generating the remainder of the code in accordance with the position of the projected image of said reticle on said array of photodetectors.

7. The scale system set forth in claim 1 wherein said array of photodetectors is a linear array with said compensated photodetector generating the least significant bit in said code and providing a means of selecting at least two distinct groups of photodetectors in said array of photodetectors for generating the remainder of said code in accordance with the position of the projected image of said reticle on said linear array of photodetectors.

8. A photoelectric encoder for generating a code in accordance with a weight on a scale, comprising:

A. a reticle having aligned columns of spaced opaque and transparent areas representing a plurality of bits in a predetermined code, B. an array of photodetectors having a compensated photodetector and at least two groupings of photodetectors for generating the plurality of bits of said predetermined code with said compensated photodetector generating the least significant bit of said predetermined code and the remainder of said code being generated from either one or the other of said two groupings of photodetectors, C. means for projecting an image of said reticle on said array of photodetectors, D. compensation means coupled to said compensated photodetector in said array of photodetectors for maintaining the position of bit generation of said compensated photodetector between transitions from opaque to transparent areas of said reticle even with changing intensity variations of said projected image, said compensation means comprising a photodetector independent of said array and used solely for compensating said compensated photodetector of said array, E. circuit means coupled to said compensated photodetector and the remainder of the array of photodetectors for selecting which of said two groupings of photodetectors in said array generates the remaining bits of said code under the control of said compensated photodetector, F. means for controlling the intensity of light applied to said independent photodetector.

9. The photoelectric encoder set forth in claim 8 wherein said array of photodetectors is a linear array.

10. The photoelectric encoder set forth in claim 8 wherein said array of photodetectors comprises two rows of photodetectors spaced one code slot apart with said compensated photodetector being positioned halfway between.

* * * * *